(12) United States Patent
Oka

(10) Patent No.: US 9,831,402 B2
(45) Date of Patent: Nov. 28, 2017

(54) LIGHT EMITTING DEVICE

(71) Applicant: NICHIA CORPORATION, Anan-shi, Tokushima (JP)

(72) Inventor: Yuta Oka, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 488 days.

(21) Appl. No.: 14/517,267

(22) Filed: Oct. 17, 2014

(65) Prior Publication Data
US 2015/0109790 A1    Apr. 23, 2015

(30) Foreign Application Priority Data

Oct. 17, 2013 (JP) ................................ 2013-216101

(51) Int. Cl.
*H01L 33/54* (2010.01)

(52) U.S. Cl.
CPC .... *H01L 33/54* (2013.01); *H01L 2224/16225* (2013.01); *H01L 2224/48091* (2013.01); *H01L 2224/48247* (2013.01); *H01L 2224/48257* (2013.01)

(58) Field of Classification Search
CPC ........... H01L 33/54; H01L 2224/16225; H01L 2224/48091; H01L 2224/48247; H01L 2224/48257
See application file for complete search history.

(56) References Cited

U.S. PATENT DOCUMENTS

| | | |
|---|---|---|
| 2006/0102914 A1 | 5/2006 | Smits et al. |
| 2006/0169999 A1 | 8/2006 | Park et al. |
| 2008/0006837 A1* | 1/2008 | Park ...................... H01L 25/167 257/98 |
| 2009/0146155 A1* | 6/2009 | Wang ...................... H01L 31/14 257/82 |
| 2009/0321773 A1 | 12/2009 | Park et al. |
| 2011/0186901 A1 | 8/2011 | Ushiyama et al. |
| 2012/0037942 A1* | 2/2012 | Sanga ..................... H01L 33/60 257/98 |
| 2013/0161672 A1 | 6/2013 | Hsieh |
| 2014/0103383 A1 | 4/2014 | Sanga |

FOREIGN PATENT DOCUMENTS

| | | |
|---|---|---|
| JP | 2005-116817 A | 4/2005 |
| JP | 2006-114671 A | 4/2006 |
| JP | 2006-210904 A | 8/2006 |
| JP | 2006-310630 A | 11/2006 |
| JP | 2007-150232 A | 6/2007 |

(Continued)

*Primary Examiner* — Donald Raleigh
*Assistant Examiner* — Kevin Quarterman
(74) *Attorney, Agent, or Firm* — Squire Patton Boggs (US) LLP

(57) ABSTRACT

A light emitting device includes a supporting base member which has an external electrode, at least one light emitting element disposed on at least a portion of an upper surface of the supporting base member. A sealing member encloses the light emitting element and has an outermost periphery larger than the supporting base member in a plan view. The supporting base member has at least one recess. The sealing member is filled in at least a portion of the recess and is formed so as to expose an electrode surface of the external electrode.

18 Claims, 11 Drawing Sheets

(56) References Cited

FOREIGN PATENT DOCUMENTS

| | | |
|---|---|---|
| JP | 20007-148332 A | 6/2007 |
| JP | 2007-273764 A | 10/2007 |
| JP | 2009-088235 A | 4/2009 |
| JP | 2009-164567 A | 7/2009 |
| JP | 2010-251666 A | 11/2010 |
| JP | 2010-267949 A | 11/2010 |
| JP | 2011-138815 A | 7/2011 |
| JP | 2011-233852 A | 11/2011 |
| JP | 2013-084827 A | 5/2013 |
| JP | 2013-138207 A | 7/2013 |

* cited by examiner

LIGHT EMITTING DEVICE

This application claims priority to Japanese Patent Application No. 2013-216101 filed on Oct. 17, 2013. The entire disclosure of Japanese Patent Application No. 2013-216101 is hereby incorporated herein by reference.

BACKGROUND

Field

The present invention relates to a light emitting device which includes at least one light emitting element.

Description of Related Art

Due to the small size and good power efficiency, semiconductor light emitting elements such as LEDs and LDs have been used for various light sources, and research on efficient extracting of light from the light emitting elements has been progressing. In order to obtain a desired directivity to the emitting light, there have been light emitting devices proposed which are provided with a sealing member to serve as a lens integrally formed therein. In those light emitting devices, further studies have been progressing on improving the light extraction efficiency and on the shape of the lens.

In a light emitting device with an integrally formed lens, the closer the relative sizes of the light emitting element and the sealing member serving as a lens becomes, the more amount of light which is emitted from the light emitting element is reflected at an larger angle than the critical angle of total reflection on the inner surface of the sealing member, resulting in a decrease in the amount of light extracted to outside.

On the other hand, with the size of the light emitting element remaining unchanged, the larger the size of the supporting base member on which the light emitting element is mounted with respect to the sealing member, the more amount of light which is emitted from the light emitting element is reflected at the sealing member absorbed by the upper surface of the supporting base member, resulting in a reduction of light extraction efficiency.

For this reason, in order to reduce the ratio of light totally reflecting at the inner surface of the sealing member, and to reduce light absorbed by the upper surface of the supporting base member, a light emitting device which includes a sealing member having a size sufficiently greater than that of the supporting base member has been proposed (see JP 2007-273764A and JP 2009-88235 A).

However, in the light emitting device which includes a sealing member having a size sufficiently greater than that of the supporting base member, external impact tends to act on the extension portion of the sealing member which is extended outward from the supporting base member, which is highly likely to cause detachment at the interface between the sealing member and the supporting base member.

The occurrence of such detachment may result in a decrease in the light extraction efficiency and/or in the life of the product, which may further deteriorate quality and/or reliability of the product.

SUMMARY

The present invention is devised in the light of such circumstances, and it is one of objects thereof to provide a light emitting device in which occurrence of detachment can be suppressed.

In certain embodiments, light emitting device includes a supporting base member which has an external electrode, a light emitting element disposed on at least a portion of an upper surface of the supporting base member, a sealing member which encloses the light emitting element and has an outermost periphery larger than the supporting base member in a plan view. The supporting base member has at least one recess on a surface. The sealing member is filled in at least a portion of the recess and formed so as to expose an electrode surface of the external electrode.

According to certain of the embodiments of the invention, the light emitting device in which detachment between the supporting base member and the sealing member can be suppressed.

DETAILED DESCRIPTION

The embodiments according to the present invention will be described below with reference to the drawings, as appropriate. The embodiments are intended as an illustration of a light emitting device to give a concrete form to technical ideas of the present invention, and the scope of the invention is not limited to those described below.

A light emitting device 100 according to certain embodiments includes, as shown in FIG. 1A to FIG. 3, a semiconductor light emitting element (hereinafter may be simply referred to as "light emitting element"), a supporting base member 2, a sealing member 1. The sealing member 1 has an outermost periphery larger than the supporting base member 2 in a plan view. In other words, the supporting base member is included in the area of the sealing member in a plan view.

Figure 1A:
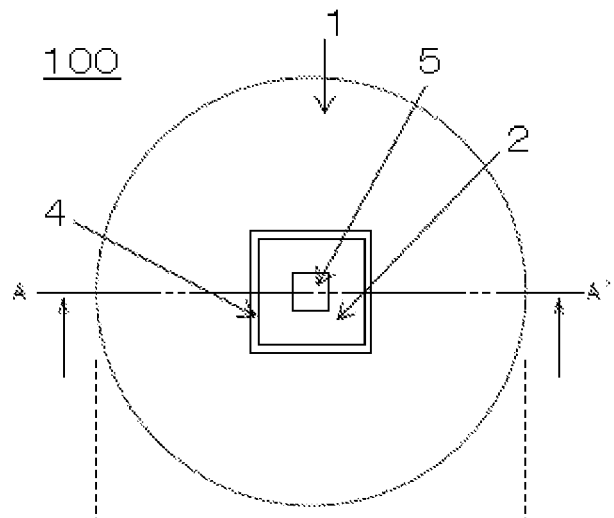
FIG. 1A is a schematic top view of a light emitting device according to an embodiment of the present invention.
Figure 1B:
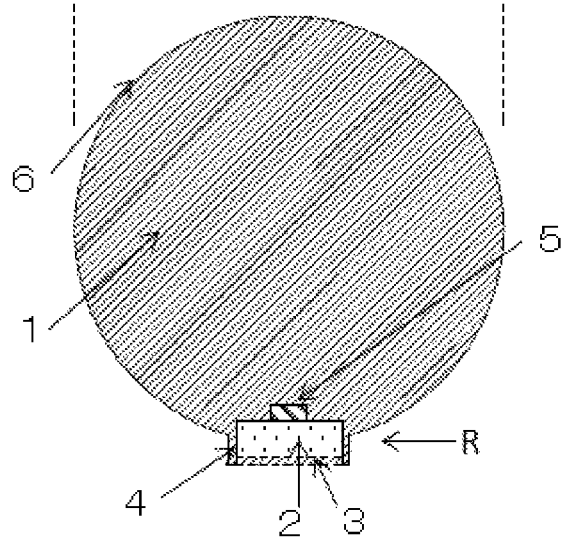
FIG. 1B is a schematic cross-sectional view taken along line A-A' of FIG. 1A.

FIG. 1A shows a light emitting device 100 in a plan view, FIG. 1B shows a cross-sectional view of the light emitting device 100 taken along line A-A' of FIG. 1A.

Figure 2:
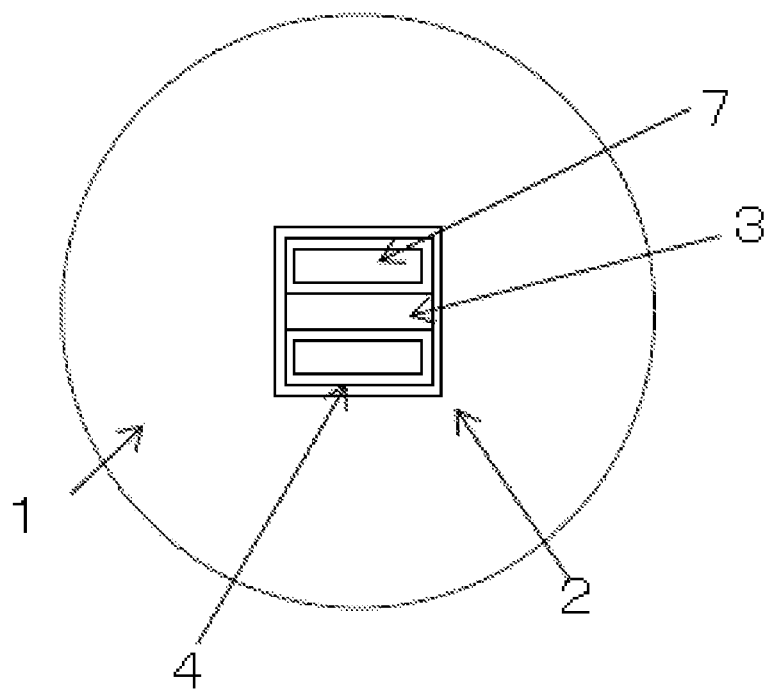
FIG. 2 is a schematic bottom view of a light emitting device according to an embodiment of the present invention.
Figure 3:
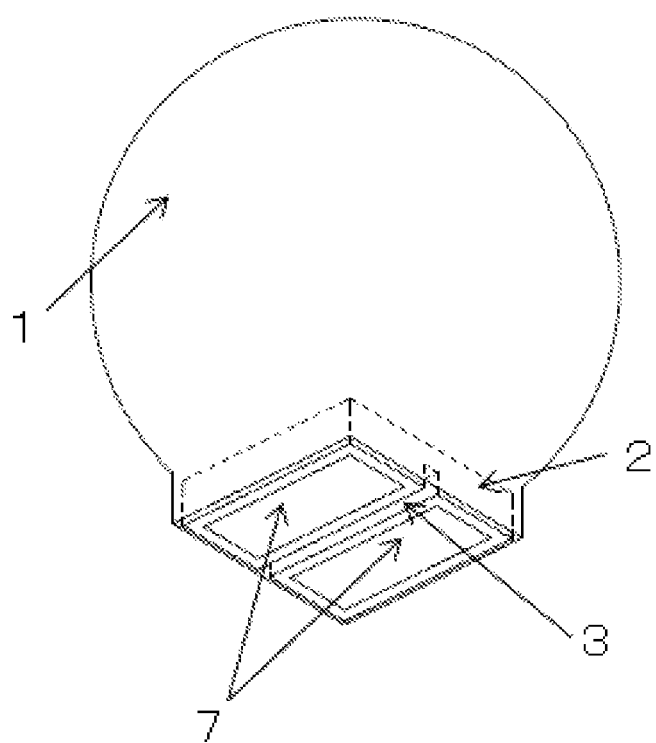
FIG. 3 is a bottom perspective view of a light emitting device according to an embodiment of the present invention.

FIG. 2 shows the light emitting device 100 in a bottom view, and FIG. 3 is a bottom perspective view of the light emitting device 100.

Light Emitting Element

The light emitting element 5 can be, for example, configured to emit blue light. The light emitting element 5 may be electrically connected and mounted on an upper surface of a supporting base member 2. For bonding, flip-chip bonding or wire bonding can be used. The light emitting element 5 may be disposed directly on the upper surface of the supporting base member 2, or may be indirectly disposed on the supporting base member 2 through a submount, etc. The light emitting element 5 can have a semiconductor light emitting element structure which at least includes a light emitting layer. Certain embodiments can include a semiconductor stacked layer structure in which a first conductive-type semiconductor layer, a light emitting layer, and a second conductive-type semiconductor layer are stacked in this order, and to which electrodes for supplying electric current to the semiconductor stacked layer structure are respectively disposed. For example, a semiconductor light emitting element structure may be formed by using a GaN-based compound semiconductor which is a nitride a semiconductor forming an n-type semiconductor layer with a thickness of about 1 to 2 μm, a light emitting layer with a thickness of about 50 to 150 nm, and a p-type semiconductor layer with a thickness of about 100 to 300 nm, on a sapphire substrate. In order to obtain efficient extraction of light, the sapphire substrate may be removed from the semiconductor layer by using lift-off or the like. The light emitting element 5 is not limited to the structure described above, and other semiconductor materials may be used to constitute the structure.

Figure 4:
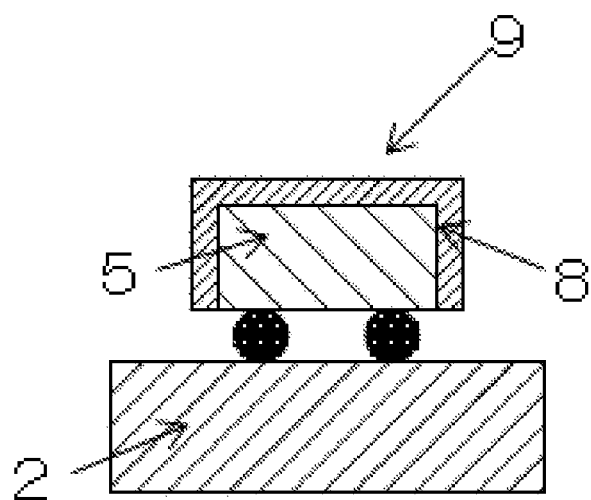
FIG. 4 is a partial cross-sectional view showing a part of a light emitting device according to an embodiment of the present invention.

The light emitting element 5 may also include a wavelength-converting or color converting member to be excited by light emitted from the light emitting element 5 and emit light of a longer wavelength than the light emitted from the light emitting element 5. For example, as shown in FIG. 4, in the case of a white light emitting element 9, outer side of a light emitting element 5 to emit blue light may be covered with a fluorescent material layer 8 which may be constituted with a fluorescent material or a resin which contains a fluorescent material. For example, a white light emitting element 9 may be obtained by combining a blue light emitting element 5 with a yellow light emitting fluorescent material, such as a YAG (yttrium aluminum garnet)-based fluorescent material activated with cerium or a silicate-based fluorescent material such as $(Sr, Ba)_2SiO_4$:Eu. Further, for the light emitting element 5, a plurality of light emitting elements 5 may be arranged spaced apart from each other, for example, in a 2×2 matrix. Then, those light emitting elements 5 may be covered collectively with a fluorescent material layer 8. As described above, with a configuration of covering the light emitting element 5 with a fluorescent material layer 8, conversion of light into a white light can be performed in the vicinity of the light emitting element 5. Thus, reflection of light at the inner surface of the sealing member 1 due to scattering of light by the fluorescent material can be suppressed, and high light extraction efficiency can be realized. Other than the configuration described above, the fluorescent material may be mixed in the sealing member 1, or the fluorescent material layer 8 may be arranged spaced apart from the light emitting element 5. Electrophoretic deposition, printing, spraying, brushing, flow coating, immersion, or potting or the like may be used for forming the fluorescent material layer.

Supporting Base Member

Figure 5A:
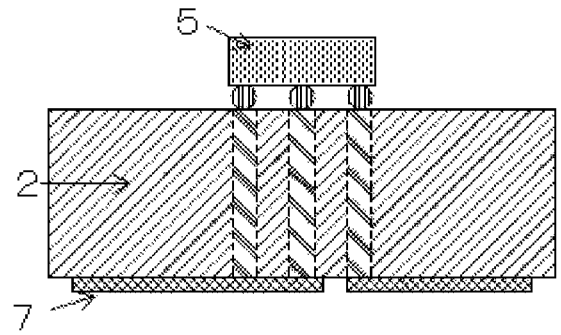
FIGS. 5A to 5C are respectively a schematic partial cross-sectional view of a light emitting element according to an embodiment of the present invention.
Figure 5B:
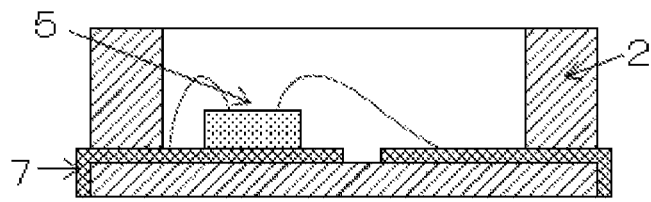
Figure 5C:
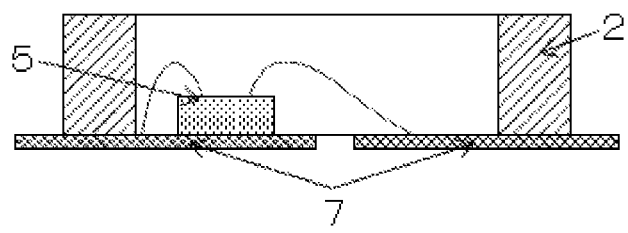

As shown in FIGS. 1A, 1B and FIG. 2, a light emitting element 5 is disposed on at least a portion of an upper surface of the supporting base member 2 which includes outer electrodes 7 and at least one recess 3 in a surface. The supporting base member 2 may be an insulating substrate member disposed with a wiring as shown in FIG. 5A, or lead frames provided with a package resin, as shown in FIGS. 5B and 5C. In the case where the lead frames are used, the recess 3 is formed in the package resin. In this case, the "external electrode 7" refers to the outer-lead portion of the lead frames. The sealing member 1 is formed so as to expose at least a part of the outer-lead portion of the lead frames. The supporting base member 2 has a shape with a stable center of gravity for supporting the sealing member 1 and allowing stable mounting to a secondary substrate etc. For example, a rectangular parallelepiped shape or a truncated cone shape may be employed.

For the insulating substrate member, for example, a ceramic substrate such as $Al_2O_3$, AlN, $Si_3N_4$, SiC etc. can be used, and at least one wiring pattern which includes an electrically conductive material such as Cu and/or Au may be disposed respectively as an inner layer. Also, a resin substrate member or a glass epoxy substrate member which is an organic material containing an inorganic material may also be used. Further, in the case where a light emitting device for high contrast is to be formed, an insulating substrate member of a dark color is preferable, and which may be obtained by containing $Cr_2O_3$, $MnO_2$, $Fe_2O_3$ etc., in the base material of the insulating substrate member.

The lead frames are respectively electrically connected to the light emitting element 5 and serve as external connection terminals. For the lead frames, a material having relatively large thermal conductivity is preferably used. With the use of such a material, heat generated from the light emitting element 5 can be efficiently released. For example, the lead frames preferably have a thermal conductivity of about 200 W/(m·K) or greater. Further, a material having relatively large mechanical strength or a material which can be easily processed in press-punching or etching can be used. Examples of such materials include metals such as copper, aluminum, gold, silver, tungsten, iron, nickel, or iron-nickel alloy, phosphor bronze, iron copper, or the like. Also, a cladding material which is formed by bonding two or more metals may be employed.

External Electrode

The external electrodes 7 disposed on the supporting base member 2 are to be electrically connected to a secondary substrate via a solder or the like. Each of the external electrodes 7 have at least a region exposed from the sealing member 1, and the exposed region serves as the electrode surface of the external electrode 7. The electrode surfaces of the external electrodes 7 may be entirely or partially exposed from the sealing member 1. As shown in FIGS. 5A to 5C, the external electrodes 7 are, for example, disposed on a side surface or a bottom surface of the supporting base member 2. The external electrodes 7 respectively have a shape which includes at least a surface which serves as the electrode surface.

Recess

The recess 3 is formed in the surface of the supporting base member 2 and is at least partially filled with material of sealing member 1, or filled with the sealing member 1, so that an anchor effect can be obtained which enhances the bonding strength between the sealing member 1 and the supporting base member. The term "surface of the supporting base member 2" includes all the surfaces: an upper surface, side surfaces, and a bottom surface, of the supporting base member 2. The recess 3 is more preferably formed in a side surface or a bottom surface of the supporting base member 2 so that a high anchor effect can be obtained. With this arrangement, the sealing member 1 filled in the recess 3 of the side surface or the bottom surface generates stress which supports the supporting base member 2, and thus detachment caused by external impact can be suppressed. More specifically, breaking of the wire which connects the supporting base member 2 and the light emitting element 5, generation of gaps between the sealing member 1 and the light emitting element 5, or the like, can be prevented.

The recess 3 may be formed, as shown in FIG. 1B, as a continuous recess 3 with constant width and depth, but it is not limited thereto, the width and the depth of the recess 3 can be arranged appropriately, and may be formed in the surface of the supporting base member 2 with uneven width and depth. The number of recess 3 is not limited to one and a plurality of the recesses 3 may be formed. The greater the total surface area of the recess 3 is, the more the anchor effect enhances, and moreover, this increases the contact area between the sealing member 1 and the supporting base member 2, facilitating release of heat of the sealing member 1 into the supporting base member 2. The recesses 3 are preferably formed symmetrically or approximately symmetrically in the supporting base member 2. With this arrangement, uneven distribution of stress in the sealing member 1 which supports the supporting base member 2 can be reduced.

The entire recesses 3 may be filled with the sealing member 1 or a portion of the recesses 3 may be filled with the sealing member 1. In the case where the entire recesses 3 is filled with the sealing member 1, good adhesive can be obtained between the sealing member 1 and the supporting base member 2, and a high anchor effect can be obtained. In the case where the sealing member 3 is filled in an only portion of the recess 3, at the time of expansion of the sealing member 1 under a high temperature, for example, a portion of the expanded sealing member 1 can be accommodated in the rest of the space in the recess 3.

As described above, the recess 3 can be formed only in the side surface or the bottom surface of the supporting base member 2, without forming in the upper surface of the supporting base member 2. This configuration can be obtained in the case where the sealing member 1 is sufficiently larger than the supporting base member 2 to easily enclose the periphery of the supporting base member 2. In the case where the recess 3 is formed in the upper surface of the supporting base member 2, light may be confined in the recess 3 located in the upper surface, resulting in a reduction of light extraction efficiency. However, according to the configuration above, such a problem can be avoided. The recess 3 in the side surface or the bottom surface may either be formed penetrating from side to side or formed not to penetrate from side to side.

Figure 6A:
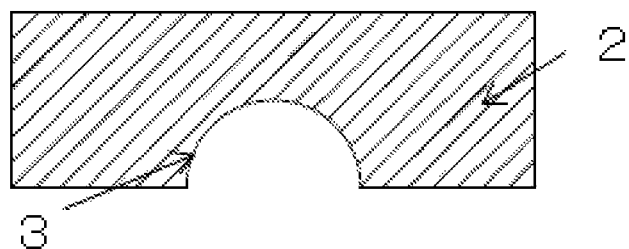
FIGS. 6A to 6C are respectively a partial cross-sectional view showing a part of a light emitting element according to an embodiment of the present invention.
Figure 6B:
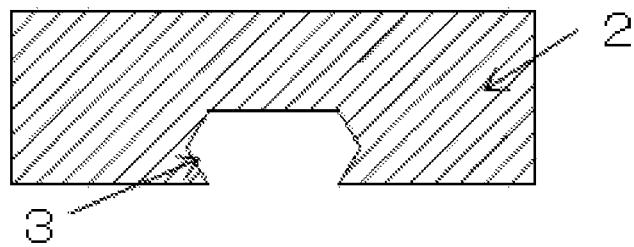
Figure 6C:
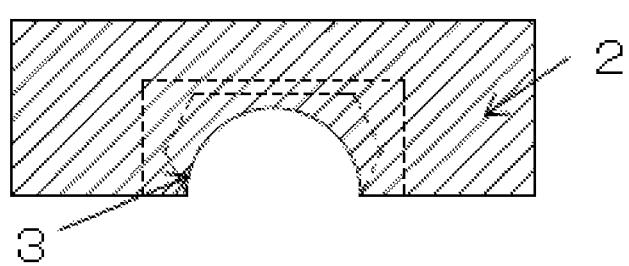

FIGS. 6A to 6C are respectively views from direction R indicated by the arrow in FIG. 1B. The shape of the recess 3 is not limited to a solid rectangular cross section, but shapes as shown in FIG. 6A and FIG. 6B, with a circular or approximately circular cutout or a polygonal or approximately polygonal with N sides (N is 3 or greater) cutout may be employed. Also, as shown in FIG. 6C, the inner walls of the recesses 3 include stacked layers of different shapes. Employing layers of different shapes in the recess increases the contact area with the sealing member 1, which allows obtaining of a higher anchor effect, and also allows releasing of heat which is accumulated in the sealing member 1 to the supporting base member 2. Thus, heat releasing property can be also improved.

Figure 7A:
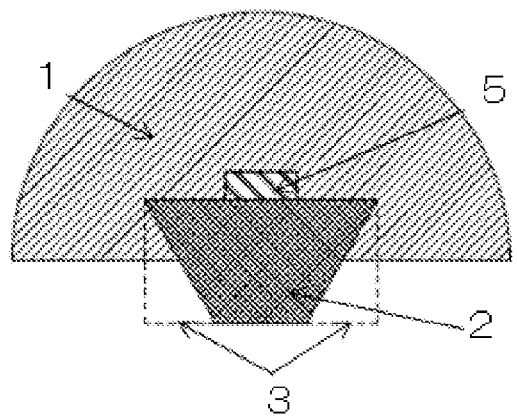
FIGS. 7A to 7C are respectively a schematic partial cross-sectional view of a light emitting element according to an embodiment of the present invention.
Figure 7B:
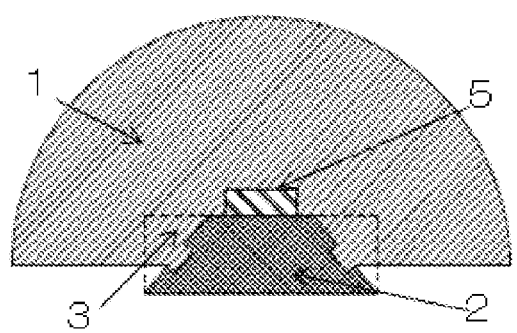
Figure 7C:
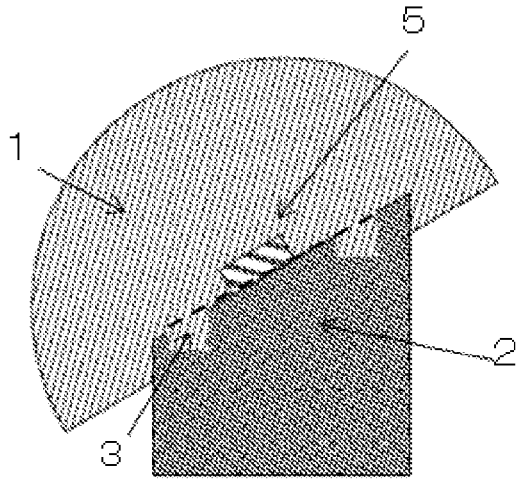

In another configuration of the recess 3, the recess 3 can be formed in a corner or a side, or corresponding portion thereof, of the supporting base member 2. As shown in FIG. 7A, the recess 3 can be formed, for example, so that the supporting base member 2 can have a polyhedral shape with N faces (N is the number of faces, which is a natural number not smaller than 4) which tapers in the direction from the upper surface to the bottom surface in a front view, or have a truncated cone shape. In this configuration, the inclined portion of the side surface of the supporting base member 2 serves as an anchor between the sealing member 1 and the supporting base member 1, and then the bonding strength between the sealing member 1 and the supporting base member 2 enhances. As shown in FIG. 7B, the recess 3 can be formed in a corner or a side, or corresponding portion thereof, of the supporting base member 2. In this configuration, light emitted from the light emitting element 5 is hardly absorbed at the upper surface of the supporting base member 2, and thus the light can be directly and effectively emitted to outside. Accordingly, the light extraction efficiency enhances. Also, a recess 3 for anchoring may be formed in the inclined portion of the side surface of the supporting base member 2. With this arrangement, the bonding strength between the sealing member 1 and the supporting base member 2 increases. Further, the recess 3 may be, as shown in FIG. 7C, formed so as to incline an upper surface of the supporting base member 2. With this arrangement, the optical axis of the light emitted from the light emitting element 5 can be adjusted in a desired direction.

Method of Forming Recess

Examples of a method of forming the recess 3 include, for example, a method of physically forming recesses 3 by way of dicing-cut or the like and a method of forming recesses 3 in a plurality of green sheets that are stacked in a ceramic substrate or the like. The method of physically forming the recesses 3 by way of dicing-cut or the like can achieve a high productivity in the case where a plurality of packages are provided on a single insulating substrate or on a collective lead frame because a large number can be processed at once with a smaller number of manufacturing processes. The method of forming recesses 3 in a stacked layer-type substrate such as a ceramics substrate is suitable to a case where recesses 3 are formed by stacking a plurality of layers because the recess 3 can be arranged in any appropriate shape and position.

Sealing Member

As shown in FIGS. 1A and 1B, the sealing member 1 includes a lens portion 6 which has an outermost periphery larger than the supporting base member 2 in a plan view and allows light to be emitted upward. Sealing member 1 also has a downward elongated portion 4 which is extended from the lens portion 6 and is elongated downward along the supporting base member 2. The term a "lens portion 6" refers to a surface of the lens. The downward elongated portion 4 allows the bonding area between the sealing member 1 and the supporting base member 2 to increase, and thus serves to enhance bonding strength and heat dissipation. The shape and the length of the downward elongated portion 4 can be appropriately arranged, but at least has a shape and length sufficient to be filled in the recess 3. Further, the downward elongated portion 4 can be disposed so that the bottom surface of the downward elongated portion 4 is located lower than the bottom surface of the supporting base member 2. In another configuration, the bottom surface of the downward elongated portion can be located at the same height or the approximately same height as the height of the bottom surface of the supporting base member. With this arrangement, the bottom surface of the downward elongated portion 4 can work so as to prevent the solder or the like from creeping up at the time of mounting to a secondary substrate or the like. Also, as shown in FIG. 2, the sealing member 1 is formed so as to expose at least the electrode surface of the external electrode 7. The sealing member 1, so as to enclose the light emitting element 5, covers at least the upper surface of the supporting base member 2 on which the light emitting element is mounted. In some embodiments, the bottom surface of the sealing member 1 is located lower than the upper surface of the supporting base member 2. In the case where the bottom surface of the sealing member 1 is on a same plane as the upper surface of the supporting base member 2, the sealing member 1 is filled only in the recess 3 formed in the upper surface of the supporting base member 2. With the arrangement in which the bottom surface of the sealing member 1 is located lower than the upper surface of the supporting base member 2, the sealing member 1 can be filled in the recess formed in a side surface or the bottom surface of the supporting base member 2. Accordingly further high effect can be provided. The term "bottom surface of the sealing member 1" refers to a surface of the sealing member 1 which is located opposite to the lens portion 6 and which is the lowermost surface of a portion of the sealing member 1 which covers the periphery of the supporting base member 2 in a height direction in a front view of the light emitting device. A portion of the sealing member 1 filled in the recess 3 is excepted from the portion. For example, in the case of the light emitting device 100 shown in FIGS. 1A and 1B, the bottom surface of the sealing member 1 refers to the bottom surface of the downward elongated portion 4, which is located opposite to the lens portion 6 which allows light to be emitted upward. The material of the sealing member 1 has light transmissive property which allows the light emitted from the light emitting element 5 transmit therethrough, and examples of such materials include silicone resins, epoxy resins, urea resins, or the like. These materials of the sealing member 1 can contain, for example, a coloring agent, a light-diffusing agent, a filler, a fluorescent material, or the like.

Lens Portion of Sealing Member

The lens portion 6 of the sealing member 1 can, in certain embodiments, have a circular shape or an approximately circular shape in a plan view as shown in FIG. 1A. In other embodiments, however, it can have a shape formed by an n-degree polynomial curve (n is 1 or greater), or a combination of those shapes. For example, the shape of the lens portion 6 may be a polygonal shape or an approximately polygonal shape with n sides (n is the number of sides, which is 3 or greater), of a flower-like shape in a plan view. Also, in a front view, it can have not only a circular shape and an approximately circular shape as shown in FIG. 1B, but also a shape formed by an n-degree polynomial curve (n is 1 or greater), or a combination of those shapes may be employed. More specifically, a fan-like shape, a convex-lens shape, a wing-type concave-lens shape, further, a lens shape such as a fresnel lens shape or a two-humped lens shape may be employed, but those shapes are referred for illustration and the shape of the lens is not limited to those shapes.

Figure 8A:
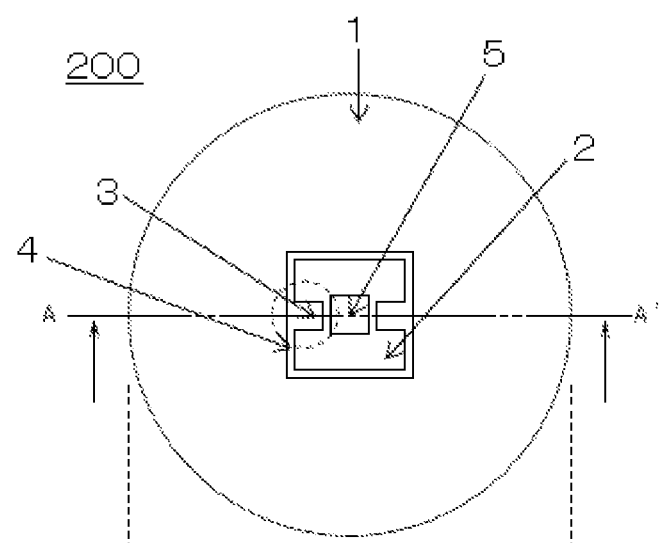
FIG. 8A is a schematic top view of a light emitting device according to an embodiment of the present invention.
Figure 8B:
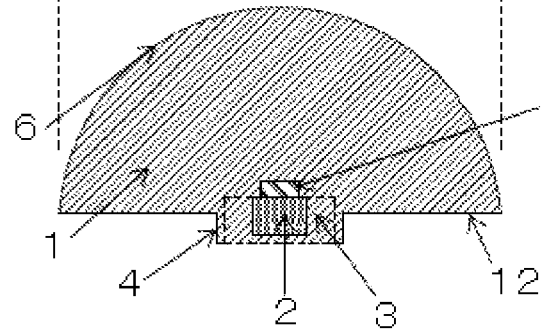
FIG. 8B is a schematic cross-sectional view taken along line A-A' of FIG. 8A.

A light emitting device 200 according to other embodiments can include, as shown in FIGS. 8A and 8B, a light emitting element 5, a supporting base member 2, a sealing member 1 which has an outermost periphery larger than the supporting base member 2 in a plan view, and also has a reflecting portion 12. Except for the configuration of the sealing member 1, the structure is similar to those in the previous embodiments, and details of those will be omitted below. FIG. 8A shows a light emitting device 200 in a plan view, FIG. 8B shows a cross-sectional view of the light emitting device 200 taken along line A-A' of FIG. 8A.

The light emitting device 200 according to these embodiments have a supporting base member 2 which includes recesses 3 each formed continuously in a side surface and the bottom surface, and the sealing member 1 is filled in the recesses 3. The sealing member 1 is formed with a lens portion 6, a reflecting portion 12 and a downward elongated portion 4 and is formed so that the electrode surfaces of the external electrodes 7 of the supporting base member 2 are exposed.

Sealing Member

As shown in FIG. 8B, the sealing member 1 includes a lens portion 6 which constitutes an upper portion, a reflecting portion 12 formed extended from the lens portion 6, and a downward elongated portion 4 which is extended from the reflecting portion 12 and elongated downward along the supporting base member 2. The configuration other than the above and the material of the sealing member 1 are similar to those in the previous embodiments.

Reflecting Portion of Sealing Member

Figure 9:
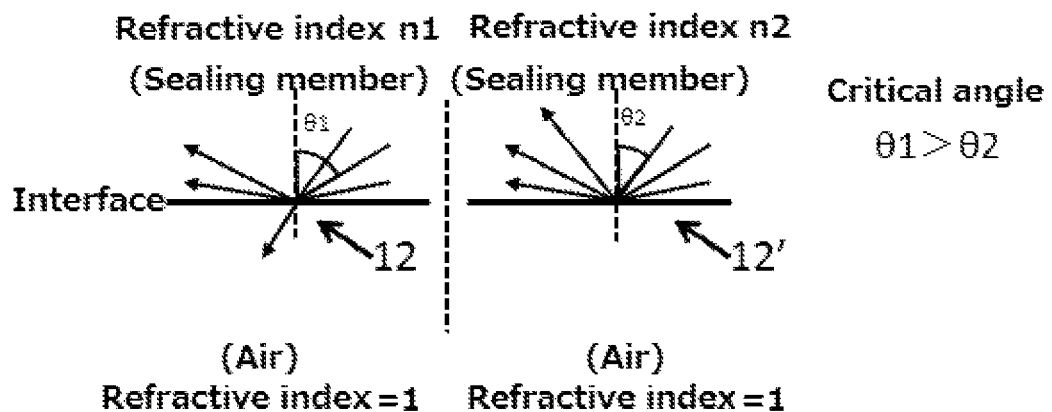
FIG. 9 is a diagram schematically illustrating total reflection according to an embodiment of the present invention.

The reflecting portion 12 serves to reflect a part of light emitted in a lateral direction or in a downward direction from the light emitting element 5 to be totally reflected in an upward direction to increase the amount of light emitting upward. In order to totally reflect the light, which is emitted in a lateral direction or in a downward direction from the light emitting element 5, at the reflecting portion 12, as shown in FIG. 9 the refractive index n should be greater than the refractive index 1 of the air. The greater the refractive index n is, the greater the amount of light totally reflected at the reflecting portion 12 is, and thus the light extraction efficiency of the light in upward direction can be increased. The shape of the reflecting portion 12 is, in a front view, not only a linear shape or an approximately linear shape as shown in FIG. 8B, but also a shape formed by an n-degree polynomial curve (n is a natural number not smaller than 1), or a combination of those shapes may be employed. In addition, a reflecting layer to generate reflection may be disposed on the surface of the reflecting portion 12 which is in contact with the air. With this embodiment, incident light with a large angle which does not generate total reflection at the reflecting portion 12 can be reflected partially at the reflecting layer, so that light from the light emitting element 5 can be reflected efficiently, not depending only on the refractive index of the sealing member 1.

Figure 10A:
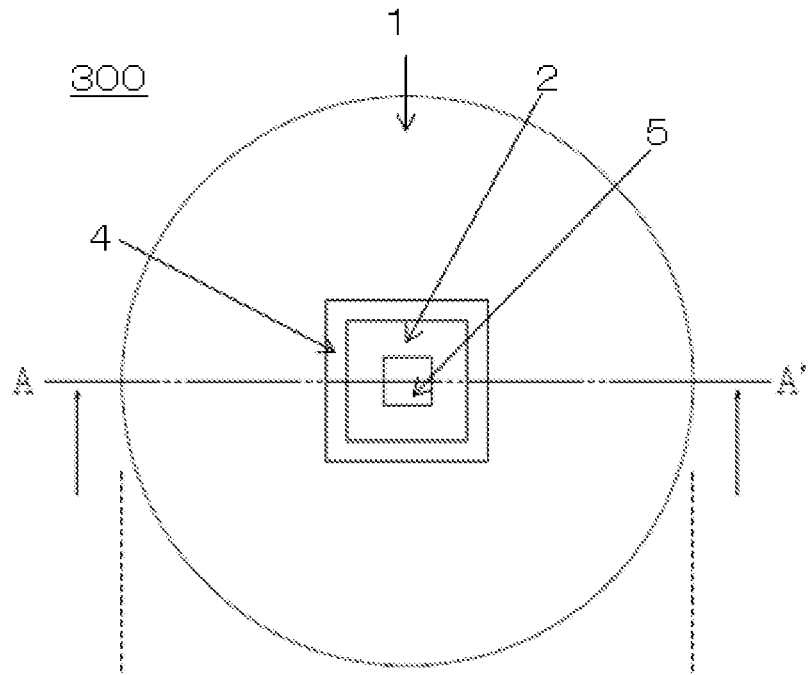
FIG. 10A is a schematic top view of a light emitting device according to an embodiment of the present invention.
Figure 10B:
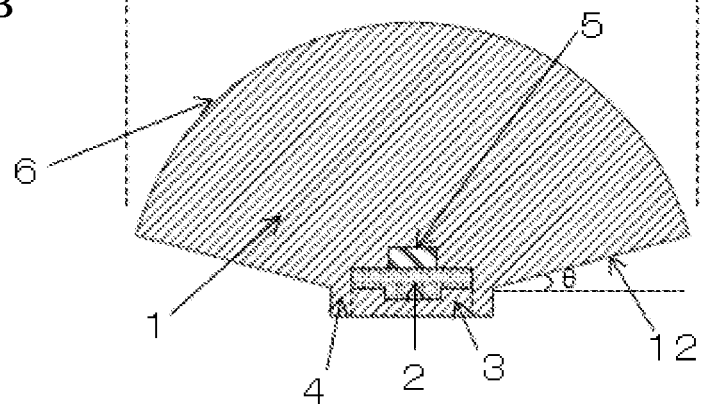
FIG. 10B is a schematic cross-sectional view taken along line A-A' of FIG. 10A.

A light emitting device 300 according to a yet other embodiments include mainly, as shown in FIGS. 10A and 10B, a light emitting element 5, a supporting base member 2, a sealing member 1 which has an outermost periphery larger than the supporting base member 2 in a plan view and which has a reflecting portion 12 which is inclined upward with respect to a lateral direction. Except for the configuration of the reflecting portion 12, the structure is similar to those in the previous embodiments and the details of those will be omitted below. FIG. 10A shows a light emitting device 300 in a plan view, FIG. 10B shows a cross-sectional view of the light emitting device 300 taken along line A-A' of FIG. 10A.

The light emitting device 300 according to these embodiments have a supporting base member 2 which includes recesses 3 each formed continuously in a side surface and the bottom surface, and the sealing member 1 is filled in the recesses 3. The sealing member 1 is formed with a lens portion 6, a reflecting portion 12 which is inclined in a lateral direction, and a downward elongated portion 4 and is formed so that the electrode surfaces of the external electrodes 7 of the supporting base member 2 are exposed.

Sealing Member

As shown in FIG. 10B, the sealing member 1 includes a lens portion 6 which constitutes an upper portion, a reflecting portion 12 formed extended from the lens portion 6 and inclined upward in a lateral direction, and a downward elongated portion 4 which is extended from the reflecting portion 12 and elongated downward along the supporting base member 2. The configuration other than the above and the material of the sealing member 1 are similar to those in the previous embodiments.

Reflecting Portion of Sealing Member

Figure 11:
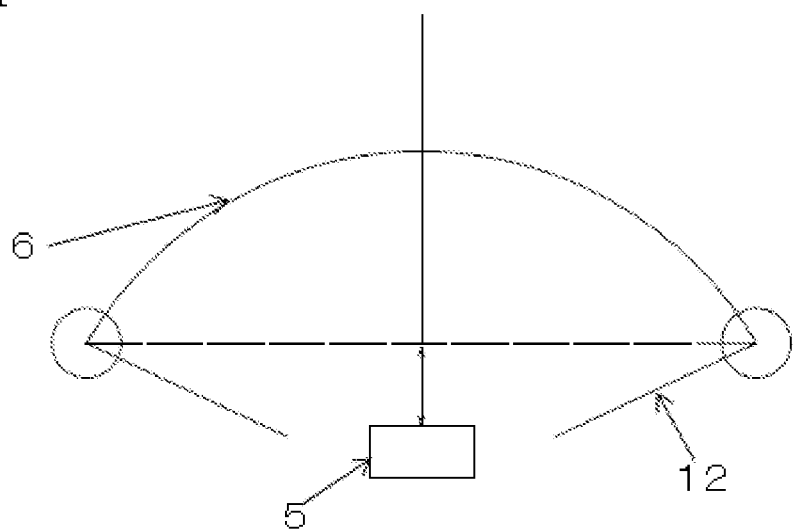
FIG. 11 is a partial cross-sectional view showing a part of a light emitting device according to an embodiment of the present invention.

The reflecting portion 12 is, as shown in FIG. 10B, formed inclined upward) ($0<\theta \leq 90°$) with respect to a lateral direction. With this arrangement, of the light emitted from the light emitting element 5 in a side direction or in a downward direction, the amount of light which leaks from an extended end portion of the sealing member 1, that is, from the point of intersection between the reflecting portion 12 and the lens 6, can be reduced. Preferably, as shown in FIG. 11, the point of intersection between the reflecting portion 12 and the lens portion 6 is located higher than the light emitting element 5. With this arrangement, light reflected at the reflecting portion 12 can be prevented from leaking downward and then being absorbed by a secondary substrate or the like, so that light can be extracted upward efficiently. As described above, it should be obvious that various other embodiments are possible without departing the spirit and scope of the present invention. Accordingly, the scope and spirit of the present invention should be limited only by the following claims.

What is claimed is:

1. A light emitting device, comprising:
  a supporting base member having an external electrode;
  at least one light emitting element disposed on at least a portion of an upper surface of the supporting base member;
  a sealing member enclosing the light emitting element and having an outermost periphery larger than the supporting base member in a plan view;
  the supporting base member having at least one recess on a surface; and
  the sealing member being filled in at least a portion of the recess and configured to expose an electrode surface of the external electrode, wherein
  the sealing member further comprises a lens portion which constitutes an upper portion,
  a reflecting portion is extended from the lens portion and is configured to reflect light emitted from the light emitting element in a lateral direction or in a downward direction to upward, and
  a downward elongated portion is extended from the reflecting portion and is elongated downward from the reflecting portion along the supporting base member.

2. The light emitting device according to claim 1, wherein a bottom surface of the sealing member is disposed lower than the upper surface of the supporting base member.

3. The light emitting device according to claim 1, wherein the recess is provided only on a side surface or a bottom surface of the supporting base member.

4. The light emitting device according to claim 1, wherein the recess is provided only on the upper surface of the supporting base member.

5. The light emitting device according to claim 1, wherein in a front view, the reflecting portion is inclined upward with respect to a lateral direction.

6. The light emitting device according to claim 1, further comprising:
  a wavelength-converting member configured to be excited by light emitted from the at least one light emitting element and to emit light of a longer wavelength than the light emitted from the light emitting element.

7. The light emitting device according to claim 1, wherein a plurality of the light emitting elements are disposed on the supporting base member.

8. The light emitting device according to claim 7, wherein the plurality of the light emitting elements are disposed in a matrix.

9. The light emitting device according to claim 1, wherein the at least one light emitting element is disposed directly on the upper surface of the supporting base member.

10. A light emitting device, comprising:
  a supporting base member;
  a light emitting element disposed on an upper surface of the supporting base member;
  a sealing member enclosing the light emitting element and having an outermost periphery larger than the supporting base member in a plan view; wherein
  the sealing member has a downward elongated portion extending downward along the side surface of the supporting base member,
  the sealing member further comprises a lens portion which constitutes an upper portion,
  a reflecting portion is configured to reflect light emitted from the light emitting element in a lateral direction or in a downward direction to upward, and
  the downward elongated portion extends downward from the reflecting portion along the supporting base member.

11. The light emitting device according to claim 10, wherein
  the supporting base member has at least one recess on at least one surface.

12. The light emitting device according to claim 10, wherein
  the bottom surface of the downward elongated portion is located at a same height or approximately same height as a height of a bottom surface of the supporting base member.

13. The light emitting device according to claim 11, wherein
  the at least one recess is disposed only on the side surface or a bottom surface of the supporting base member.

14. The light emitting device according to claim 11, wherein
  the at least one recess is provided only on the upper surface of the supporting base member.

15. The light emitting device according to claim 10, wherein
  in a front view, the reflecting portion is inclined upward with respect to a lateral direction.

16. The light emitting device according to claim 10, wherein
   a plurality of the light emitting elements are disposed on the supporting base member.

17. The light emitting device according to claim 16, wherein
   a plurality of the light emitting elements are disposed in a matrix.

18. The light emitting device according to claim 10, wherein
   the at least one light emitting element is disposed directly on the upper surface of the supporting base member.

* * * * *